United States Patent
Byun et al.

(10) Patent No.: US 6,620,723 B1
(45) Date of Patent: Sep. 16, 2003

(54) FORMATION OF BORIDE BARRIER LAYERS USING CHEMISORPTION TECHNIQUES

(75) Inventors: Jeong Soo Byun, Cupertino, CA (US); Alfred Mak, Union City, CA (US)

(73) Assignee: Applied Materials, Inc., Santa Clara, CA (US)

(*) Notice: Subject to any disclaimer, the term of this patent is extended or adjusted under 35 U.S.C. 154(b) by 232 days.

(21) Appl. No.: 09/604,943

(22) Filed: Jun. 27, 2000

(51) Int. Cl.[7] .......................................... H01L 21/4763
(52) U.S. Cl. ...................................... 438/627; 438/628
(58) Field of Search ................................ 438/584, 627, 438/628, 648, 652, 653, 656, 683, 685

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,625 A | 8/1989 | Nishizawa et al. | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |
| 4,976,839 A * | 12/1990 | Inoue | 204/192.17 |
| 4,993,357 A | 2/1991 | Scholz | 118/715 |
| 5,000,113 A | 3/1991 | Wang et al. | 118/723 |
| 5,013,683 A | 5/1991 | Petroff et al. | 437/110 |
| 5,082,798 A | 1/1992 | Arimoto | 437/108 |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | 437/111 |

(List continued on next page.)

FOREIGN PATENT DOCUMENTS

| | | | |
|---|---|---|---|
| DE | 2 203 776 | 8/1973 | B23K/35/12 |
| DE | 196 27 017 A1 | 1/1997 | H01L/21/283 |

(List continued on next page.)

OTHER PUBLICATIONS

Choi, et al., "The Effect of Annealing on Resistivity of Low Pressure Chemical Vapor Deposited Titanium Diboride," Journal of Applied Physics, Jun. 1, 1991, p. 7853–7861.

Choi, et al., "Stability of TiB2 as a Diffusion Barrier on Silicon," Journal of the Electrochemical Society, Oct. 1991, vol. 138, No. 10, p. 3062–3067.

(List continued on next page.)

*Primary Examiner*—William David Coleman
(74) *Attorney, Agent, or Firm*—Moser Patterson & Sheridan (57) ABSTRACT

A method of forming a boride layer for integrated circuit fabrication is disclosed. In one embodiment, the boride layer is formed by chemisorbing monolayers of a boron containing compound and one refractory metal compound onto a substrate. In an alternate embodiment, the boride layer has a composite structure. The composite boride layer structure comprises two or more refractory metals. The composite boride layer is formed by sequentially chemisorbing monolayers of a boron compound and two or more refractory metal compounds on a substrate.

4 Claims, 7 Drawing Sheets

U.S. PATENT DOCUMENTS

| | | | |
|---|---|---|---|
| 5,166,092 A | 11/1992 | Mochizuki et al. | 437/105 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | 437/108 |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | 156/611 |
| 5,254,207 A | 10/1993 | Nishizawa et al. | 156/601 |
| 5,256,244 A | 10/1993 | Ackerman | 156/613 |
| 5,259,881 A | 11/1993 | Edwards et al. | 118/719 |
| 5,270,247 A | 12/1993 | Sakuma et al. | 437/133 |
| 5,278,435 A | 1/1994 | Van Hove et al. | 257/184 |
| 5,281,274 A | 1/1994 | Yoder | 118/697 |
| 5,286,296 A | 2/1994 | Sato et al. | 118/719 |
| 5,290,748 A | 3/1994 | Knuuttila et al. | 502/228 |
| 5,294,286 A | 3/1994 | Nishizawa et al. | 156/610 |
| 5,296,403 A | 3/1994 | Nishizawa et al. | 437/133 |
| 5,300,186 A | 4/1994 | Kitahara et al. | 156/613 |
| 5,311,055 A | 5/1994 | Goodman et al. | 257/593 |
| 5,316,615 A | 5/1994 | Copel | 117/95 |
| 5,316,793 A | 5/1994 | Wallace et al. | 427/248.1 |
| 5,330,610 A | 7/1994 | Eres et al. | 117/86 |
| 5,336,324 A | 8/1994 | Stall et al. | 118/719 |
| 5,338,389 A | 8/1994 | Nishizawa et al. | 117/89 |
| 5,348,911 A | 9/1994 | Jurgensen et al. | 117/91 |
| 5,374,570 A | 12/1994 | Nasu et al. | 437/40 |
| 5,395,791 A | 3/1995 | Cheng et al. | 437/105 |
| 5,438,952 A | 8/1995 | Otsuka | 117/92 |
| 5,439,876 A | 8/1995 | Graf et al. | 505/447 |
| 5,441,703 A | 8/1995 | Jurgensen | 422/129 |
| 5,443,033 A | 8/1995 | Nishizawa et al. | 117/86 |
| 5,443,647 A | 8/1995 | Aucoin et al. | 118/723 ME |
| 5,455,072 A | 10/1995 | Bension et al. | 427/255.7 |
| 5,458,084 A | 10/1995 | Thorne et al. | 117/89 |
| 5,469,806 A | 11/1995 | Mochizuki et al. | 117/97 |
| 5,480,818 A | 1/1996 | Matsumoto et al. | 437/40 |
| 5,483,919 A | 1/1996 | Yokoyama et al. | 117/89 |
| 5,484,664 A | 1/1996 | Kitahara et al. | 428/641 |
| 5,503,875 A | 4/1996 | Imai et al. | 427/255.3 |
| 5,521,126 A | 5/1996 | Okamura et al. | 437/235 |
| 5,527,733 A | 6/1996 | Nishizawa et al. | 437/160 |
| 5,532,511 A | 7/1996 | Nishizawa et al. | 257/627 |
| 5,540,783 A | 7/1996 | Eres et al. | 118/725 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,637,530 A | 6/1997 | Gaines et al. | 114/105 |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,693,139 A | 12/1997 | Nishizawa et al. | 117/89 |
| 5,695,564 A | 12/1997 | Imahashi | 118/719 |
| 5,705,224 A | 1/1998 | Murota et al. | 427/248.1 |
| 5,707,880 A | 1/1998 | Aftergut et al. | 437/3 |
| 5,711,811 A | 1/1998 | Suntola et al. | 118/719 |
| 5,730,801 A | 3/1998 | Tepman et al. | 118/719 |
| 5,730,802 A | 3/1998 | Ishizumi | 118/719 |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,851,849 A | 12/1998 | Comizzoli et al. | 438/38 |
| 5,855,675 A | 1/1999 | Doering et al. | 118/719 |
| 5,855,680 A | 1/1999 | Soininen et al. | 118/719 |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | 73/1.36 |
| 5,879,459 A | 3/1999 | Gadgil et al. | 118/715 |
| 5,882,165 A | 3/1999 | Maydan et al. | 414/217 |
| 5,882,413 A | 3/1999 | Beaulieu et al. | 118/719 |
| 5,904,565 A | 5/1999 | Nguyen et al. | 438/687 |
| 5,916,365 A | 6/1999 | Sherman | 117/92 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,942,799 A * | 8/1999 | Danek et al. | 257/751 |
| 5,947,710 A | 9/1999 | Cooper et al. | 418/63 |
| 5,972,430 A | 10/1999 | DiMeo, Jr. et al. | 427/255.32 |
| 6,001,669 A | 12/1999 | Gaines et al. | 438/102 |
| 6,015,590 A | 1/2000 | Suntola et al. | 427/255.23 |
| 6,025,627 A | 2/2000 | Forbes et al. | 257/321 |
| 6,036,773 A | 3/2000 | Wang et al. | 117/97 |
| 6,042,652 A | 3/2000 | Hyun et al. | 118/719 |
| 6,043,177 A | 3/2000 | Falconer et al. | 502/4 |
| 6,051,286 A | 4/2000 | Zhao et al. | 427/576 |
| 6,062,798 A | 5/2000 | Muka | 414/416 |
| 6,071,808 A | 6/2000 | Merchant et al. | 438/633 |
| 6,084,302 A | 7/2000 | Sandhu | 257/751 |
| 6,086,677 A | 7/2000 | Umotoy et al. | 118/715 |
| 6,110,556 A | 8/2000 | Bang et al. | 428/64.1 |
| 6,113,977 A | 9/2000 | Soininen et al. | 427/64 |
| 6,117,244 A | 9/2000 | Bang et al. | 118/715 |
| 6,124,158 A | 9/2000 | Dautartas et al. | 438/216 |
| 6,130,147 A | 10/2000 | Major et al. | 438/604 |
| 6,139,700 A | 10/2000 | Kang et al. | 204/192.17 |
| 6,140,237 A | 10/2000 | Chan et al. | 438/687 |
| 6,140,238 A | 10/2000 | Kitch | 438/687 |
| 6,143,659 A | 11/2000 | Leem | 438/688 |
| 6,144,060 A | 11/2000 | Park et al. | 257/310 |
| 6,158,446 A | 12/2000 | Mohindra et al. | 134/25.4 |
| 6,174,377 B1 | 1/2001 | Doering et al. | 118/729 |
| 6,174,809 B1 | 1/2001 | Kang et al. | 438/682 |
| 6,200,893 B1 | 3/2001 | Sneh | 438/685 |
| 6,203,613 B1 | 3/2001 | Gates et al. | 117/104 |
| 6,206,967 B1 | 3/2001 | Mak et al. | 118/666 |
| 6,207,302 B1 | 3/2001 | Sugiura et al. | 428/690 |
| 6,248,605 B1 | 6/2001 | Harkonen et al. | 438/29 |
| 6,270,572 B1 | 8/2001 | Kim et al. | 117/93 |
| 6,271,148 B1 | 8/2001 | Kao et al. | 438/727 |
| 6,287,965 B1 | 9/2001 | Kang et al. | 438/648 |
| 6,291,876 B1 | 9/2001 | Stumborg et al. | 257/632 |
| 6,305,314 B1 | 10/2001 | Sneh et al. | 118/723 R |
| 6,306,216 B1 | 10/2001 | Kim et al. | 118/725 |
| 6,316,098 B1 | 11/2001 | Yitzchaik et al. | 428/339 |
| 6,342,277 B1 * | 1/2002 | Sherman | 117/103 |
| 2001/0000866 A1 | 5/2001 | Sneh, et al. | 118/723 R |
| 2001/0009140 A1 | 7/2001 | Bondestam et al. | 118/725 |
| 2001/0011526 A1 | 8/2001 | Doering et al. | 118/729 |
| 2001/0031562 A1 | 10/2001 | Raaijmakers et al. | 438/770 |
| 2001/0034123 A1 | 10/2001 | Jeon et al. | 438/643 |
| 2001/0041250 A1 | 11/2001 | Werkhoven et al. | 428/212 |

FOREIGN PATENT DOCUMENTS

| | | | | |
|---|---|---|---|---|
| DE | 198 20 147 A1 | 7/1999 | | H01L/21/3205 |
| EP | 62-091495 | 4/1987 | | C30B/25/02 |
| EP | 0 344 352 A1 | 6/1988 | | H01L/39/24 |
| EP | 0 442 290 A1 | 2/1991 | | C30B/25/02 |
| EP | 0 429 270 A2 | 5/1991 | | G03F/7/36 |
| EP | 0 442 490 A1 | 8/1991 | | C30B/25/02 |
| EP | 0 799 641 A2 | 10/1997 | | B01J/20/32 |
| EP | 1 146 141 A2 | 10/2001 | | C23C/16/40 |

| | | | | | | | |
|---|---|---|---|---|---|---|---|
| FR | 2.626.110 | 7/1989 | H01L/39/24 | JP | 03-070124 | 3/1991 | H01L/21/205 |
| FR | 2.692.597 | 12/1993 | C23C/16/00 | JP | 03-185716 | 8/1991 | H01L/21/205 |
| GB | 2 355 727 A | 5/2001 | C23C/16/44 | JP | 03-208885 | 9/1991 | C30B/23/02 |
| JP | 58-098917 | 6/1983 | H01L/21/205 | JP | 03-234025 | 10/1991 | H01L/21/318 |
| JP | 58-100419 | 6/1983 | H01L/21/20 | JP | 03-286522 | 12/1991 | H01L/21/205 |
| JP | 60-065712 A | 4/1985 | C01B/33/113 | JP | 03-286531 | 12/1991 | H01L/21/316 |
| JP | 61-035847 | 2/1986 | B01J/19/08 | JP | 04-031391 | 2/1992 | C30B/23/08 |
| JP | 61-210623 | 9/1986 | H01L/21/205 | JP | 04-031396 | 2/1992 | C30B/25/14 |
| JP | 62-069508 | 3/1987 | H01L/21/203 | JP | 04-100292 | 4/1992 | H01S/3/18 |
| JP | 62-141717 | 6/1987 | H01L/21/203 | JP | 04-111418 | 4/1992 | H01L/21/205 |
| JP | 62-167297 | 7/1987 | C30B/29/40 | JP | 04-132214 | 5/1992 | H01L/21/205 |
| JP | 62-171999 | 7/1987 | C30B/29/40 | JP | 04-132681 | 5/1992 | C30B/25/14 |
| JP | 62-232919 | 10/1987 | H01L/21/205 | JP | 04/151822 | 5/1992 | H01L/21/205 |
| JP | 63-062313 | 3/1988 | H01L/21/203 | JP | 04-162418 | 6/1992 | H01L/21/205 |
| JP | 63-085098 | 4/1988 | C30B/21/40 | JP | 04-175299 | 6/1992 | C30B/29/68 |
| JP | 63-090833 | 4/1988 | H01L/21/365 | JP | 04-186824 | 7/1992 | H01L/21/205 |
| JP | 63-222420 | 9/1988 | H01L/21/205 | JP | 04-212411 | 8/1992 | H01L/21/203 |
| JP | 63-222421 | 9/1988 | H01L/21/205 | JP | 04-260696 | 9/1992 | C30B/29/40 |
| JP | 63-227007 | 9/1988 | H01L/21/205 | JP | 04-273120 | 9/1992 | H01L/21/20 |
| JP | 63-252420 | 10/1988 | H01L/21/205 | JP | 04-285167 | 10/1992 | C23C/14/54 |
| JP | 63-266814 | 11/1988 | H01L/21/205 | JP | 04-291916 | 10/1992 | H01L/21/205 |
| JP | 64-009895 | 1/1989 | C30B/29/40 | JP | 04-325500 | 11/1992 | C30B/33/00 |
| JP | 64-009896 | 1/1989 | C30B/29/40 | JP | 04-328874 | 11/1992 | H01L/29/804 |
| JP | 64-009897 | 1/1989 | C30B/29/40 | JP | 05-029228 | 2/1993 | H01L/21/205 |
| JP | 64-037832 | 2/1989 | H01L/21/205 | JP | 05-047665 | 2/1993 | H01L/21/205 |
| JP | 64-082615 | 3/1989 | H01L/21/205 | JP | 05-047666 | 2/1993 | H01L/21/205 |
| JP | 64-082617 | 3/1989 | H01L/21/205 | JP | 05-047668 | 2/1993 | H01L/21/205 |
| JP | 64-082671 | 3/1989 | H01L/29/78 | JP | 05-074717 | 3/1993 | H01L/21/205 |
| JP | 64-082676 | 3/1989 | H01L/29/80 | JP | 05-074724 | 3/1993 | H01L/21/205 |
| JP | 01-103982 | 4/1989 | C30B/23/08 | JP | 05-102189 | 4/1993 | H01L/21/336 |
| JP | 01-103996 | 4/1989 | C30B/29/40 | JP | 05-160152 | 6/1993 | H01L/21/336 |
| JP | 64-090524 | 4/1989 | H01L/21/205 | JP | 05-175143 | 7/1993 | H01L/21/205 |
| JP | 01-117017 | 5/1989 | H01L/21/203 | JP | 05-175145 | 7/1993 | H01L/21/205 |
| JP | 01-143221 | 6/1989 | H01L/21/314 | JP | 05-182906 | 7/1993 | H01L/21/20 |
| JP | 01-143233 | 6/1989 | H01L/21/76 | JP | 05-186295 | 7/1993 | C30B/25/02 |
| JP | 01-154511 | 6/1989 | H01L/21/20 | JP | 05-206036 | 8/1993 | H01L/21/205 |
| JP | 01-236657 | 9/1989 | H01L/29/80 | JP | 05-234899 | 9/1993 | H01L/21/205 |
| JP | 01-245512 | 9/1989 | H01L/21/205 | JP | 05-235047 | 9/1993 | H01L/21/338 |
| JP | 01-264218 | 10/1989 | H01L/21/205 | JP | 05-251339 | 9/1993 | H01L/21/20 |
| JP | 01-270593 | 10/1989 | C30B/25/02 | JP | 05-270997 | 10/1993 | C30B/29/68 |
| JP | 01-272108 | 10/1989 | H01L/21/203 | JP | 05-283336 | 10/1993 | H01L/21/20 |
| JP | 01-290221 | 11/1989 | H01L/21/205 | JP | 05-291152 | 11/1993 | H01L/21/205 |
| JP | 01-290222 | 11/1989 | H01L/21/205 | JP | 05-304334 | 11/1993 | H01L/3/18 |
| JP | 01-296673 | 11/1989 | H01L/29/88 | JP | 05-343327 | 12/1993 | H01L/21/205 |
| JP | 01-303770 | 12/1989 | H01L/39/24 | JP | 05-343685 | 12/1993 | H01L/29/784 |
| JP | 01-305894 | 12/1989 | C30B/23/08 | JP | 06-045606 | 2/1994 | H01L/29/784 |
| JP | 01-313927 | 12/1989 | H01L/21/205 | JP | 06-132236 | 5/1994 | H01L/21/205 |
| JP | 02-012814 | 1/1990 | H01L/21/205 | JP | 06-177381 | 6/1994 | H01L/29/784 |
| JP | 02-014513 | 1/1990 | H01L/21/205 | JP | 06-196809 | 7/1994 | H01S/3/18 |
| JP | 02-017634 | 1/1990 | H01L/21/225 | JP | 06-222388 | 8/1994 | G02F/1/136 |
| JP | 02-063115 | 3/1990 | H01L/21/20 | JP | 06-224138 | 8/1994 | H01L/21/205 |
| JP | 02-074029 | 3/1990 | H01L/21/205 | JP | 06-230421 | 8/1994 | G02F/1/136 |
| JP | 02-074587 | 3/1990 | C30B/23/08 | JP | 06-252057 | 9/1994 | H01L/21/205 |
| JP | 02-106822 | 4/1990 | H01B/13/00 | JP | 06-291048 | 10/1994 | H01L/21/205 |
| JP | 02-129913 | 5/1990 | H01L/21/205 | JP | 07-070752 | 3/1995 | C23C/16/40 |
| JP | 02-162717 | 6/1990 | H01L/21/20 | JP | 07-086269 | 3/1995 | H01L/21/314 |
| JP | 02-172895 | 7/1990 | C30B/29/36 | JP | 08-181076 | 7/1996 | H01L/21/205 |
| JP | 02-196092 | 8/1990 | C30B/25/14 | JP | 08-245291 | 9/1996 | C30B/25/14 |
| JP | 02-203517 | 8/1990 | H01L/21/205 | JP | 08-264530 | 10/1996 | H01L/21/3205 |
| JP | 02-230690 | 9/1990 | H05B/33/10 | JP | 09-260786 | 10/1997 | H01S/3/18 |
| JP | 02-230722 | 9/1990 | H01L/21/205 | JP | 09-293681 | 11/1997 | H01L/21/205 |
| JP | 02-246161 | 10/1990 | H01/29/784 | JP | 10-188840 | 7/1998 | H01J/29/18 |
| JP | 02-264491 | 10/1990 | H01S/3/18 | JP | 10-190128 | 7/1998 | H01S/3/18 |
| JP | 02-283084 | 11/1990 | H01S/3/18 | JP | 10-308283 | 11/1998 | H05B/33/22 |
| JP | 02-304916 | 12/1990 | H01L/21/205 | JP | 11-269652 | 10/1999 | C23C/16/44 |
| JP | 03-019211 | 1/1991 | H01L/21/205 | JP | 2000-031387 | 1/2000 | H01L/27/04 |
| JP | 03-022569 | 1/1991 | H01L/29/804 | JP | 2000-058777 | 2/2000 | H01L/27/108 |
| JP | 03-023294 | 1/1991 | C30B/25/18 | JP | 2000-068072 | 3/2000 | H05B/33/22 |
| JP | 03-023299 | 1/1991 | C30B/29/40 | JP | 2000-087029 | 3/2000 | C09K/11/08 |
| JP | 03-044967 | 2/1991 | H01L/29/48 | JP | 2000-319772 | 3/2000 | C23C/16/00 |
| JP | 03-048421 | 3/1991 | H01L/21/302 | JP | 2000-138094 | 5/2000 | H05B/33/10 |

| | | | | |
|---|---|---|---|---|
| JP | 2000-218445 | 8/2000 | ............. B23P/6/00 |
| JP | 2000-319772 | 11/2000 | ........... C23C/14/24 |
| JP | 2000-340883 | 12/2000 | ........... H01S/5/125 |
| JP | 2000-353666 | 12/2000 | ........ H01L/21/205 |
| JP | 2001-020075 | 1/2001 | ........... C23C/16/44 |
| JP | 2001-62244 | 3/2001 | ........... B01D/53/34 |
| JP | 2001-152339 | 6/2001 | ........... C23C/16/40 |
| JP | 2001-172767 | 6/2001 | ........... C23C/16/40 |
| JP | 2001-189312 | 7/2001 | ......... H01L/21/316 |
| JP | 2001-217206 | 8/2001 | ......... H01L/21/285 |
| JP | 2001-220287 | 8/2001 | ........... C30B/25/02 |
| JP | 2001-220294 | 8/2001 | ........... C30B/29/20 |
| JP | 2001-240972 | 9/2001 | ........ C23C/16/458 |
| JP | 2001-254181 | 9/2001 | ........... C23C/16/46 |
| JP | 2001-284042 | 10/2001 | ........... H05B/33/04 |
| JP | 2001-303251 | 10/2001 | ........... C23C/16/44 |
| JP | 2001-328900 | 11/2001 | ........... C30B/29/68 |
| WO | 90/02216 | 3/1990 | ........... C23C/14/34 |
| WO | 91/10510 | 7/1991 | ............ B01J/37/02 |
| WO | 93/0211 | 2/1993 | ............. C08F/4/78 |
| WO | 96/17107 | 6/1996 | ........... C23C/16/44 |
| WO | 96/18756 | 6/1996 | ........... C23C/16/08 |
| WO | 98/06889 | 2/1998 | |
| WO | 99/13504 | 3/1999 | ........... H01L/21/68 |
| WO | 99/29924 | 6/1999 | ........... C23C/16/04 |
| WO | 99/41423 | 8/1999 | |
| WO | 00/11721 | 3/2000 | ........... H01L/29/43 |
| WO | WO 00/11721 | 3/2000 | ........... H01L/29/43 |
| WO | 00/15865 | 3/2000 | ........... C23C/16/00 |
| WO | 00/15881 A2 | 3/2000 | |
| WO | 00/16377 A2 | 3/2000 | |
| WO | 00/54320 A1 | 9/2000 | ........... H01L/21/44 |
| WO | 00/63957 A1 | 10/2000 | ........ H01L/21/205 |
| WO | 00/79019 A1 | 12/2000 | ........... C23C/16/00 |
| WO | 00/79576 A1 | 12/2000 | ........ H01L/21/205 |
| WO | WO 01/15220 A1 | 3/2001 | ........ H01L/21/768 |
| WO | 01/15220 A1 | 3/2001 | ........ H01L/21/768 |
| WO | 01-15220 | 3/2001 | ........ H01L/21/768 |
| WO | 01/27346 A1 | 4/2001 | ........... C23C/16/44 |
| WO | 01/29280 A1 | 4/2001 | ........... H01L/21/00 |
| WO | 01/29891 A1 | 4/2001 | ........ H01L/21/768 |
| WO | 01/29893 A1 | 4/2001 | ........ H01L/21/768 |
| WO | 01/27347 1 | 4/2001 | ........... C23C/16/44 |
| WO | 01/36702 A1 | 5/2001 | ........... C23C/16/00 |
| WO | 01/40541 A1 | 6/2001 | ........... C23C/16/40 |
| WO | 01/66832 A2 | 9/2001 | ........... C23C/16/44 |

OTHER PUBLICATIONS

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2–$\mu m$ contact filing by 450° C–hydrazine–reduced TiN film with low resistivity", IEDM 92–979, pp. 11.8.1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IMB Tech. Disc. Bull. "Multiprocessor and Multitasking Architecture for Tool Control of the Advanced via Inspection Tools" (May 1992), pp. 190–191.

McGeachin, S., "Synthesis and properties of some β–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition/ Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

"Cluster Tools for Fabrication of Advanced devices" Jap. J. of Applied Physics, Extended Abstracts, 22nd Conference Solid State Devices and Materials (1990), pp. 849–852 XP000178141.

"Applications of Integrated processing", Solid State Technology, US, Cowan Pub., vol. 37, No. 12 (Dec. 1, 1994), pp. 45–47.

Kitagawa, et al., "Hydrogen–mediated low temperature epitaxy of Si in plasma–enhanced chemical vapor deposition", Applied Surface Science (2000), pp. 30–34.

Lee, et al., "Pulsed nucleation for ultra–high aspect ratio tungsten plugfill", Novellus Systems, Inc. (2001), pp. 1–2 (Copy Not Available To Applicant At This Time).

PCT International Search Report from PCT/US 01/20310, Dated Feb. 14, 2002.

Hultman, et al., "Review of the thermal and mechanical stability of TiN–based thin films", Zeitschrift Fur Metalkunde, 90(10) (Oct. 1999), pp. 803–813.

Klaus, et al., "Atomic Layer Deposition of $SiO_2$ Using Catalyzed and Uncatalyzed Self–Limiting Surface Reactions", Surface Review & Letters, 6(3&4) (1999), pp. 435–448.

Yamaguchi, et al., "Atomic–layer chemical–vapor–deposition of silicon dioxide films with extremely low hydrogen content", Appl. Surf. Sci., vol. 130–132 (1998), pp. 202–207.

George, et al., "Surface Chemistry for Atomic Layer Growth", J. Phys. Chem., vol. 100 (1996), pp. 13121—131.

George, et al., "Atomic layer controlled deposition of $SiO_2$ and $Al_2O_3$ using ABAB . . . binary reaction sequence chemistry", Appl. Surf. Sci., vol. 82/83 (1994), pp. 460–467.

Wise, et al., "Diethyldiethoxysilane as a new precursor for SiO$_2$ growth on silicon", *Mat. Res. Soc. Symp. Proc.*, vol. 334 (1994), pp. 37–43.

Niinisto, et al., "Synthesis of oxide thin films and overlayers by atomic layer epitaxy for advanced applications", *Mat. Sci. & Eng.*, vol. B41 (1996), pp. 23–29.

Ritala, et al., "Perfectly conformal TiN and Al$_2$O$_3$ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions". *Appl. Surf. Sci.*, vol. 162–163 (Jul. 1999), pp. 479–491.

Klaus, et al., "Atomically controlled growth of tungsten and tungsten nitride using sequential surface reactions", *Fifth Int'l Symp. On Atomically Controlled Surfaces, Interfaces and Nanostructures* (Jul. 6–9, 1999), Aix en Provence, France.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13–16, 1998), pp. 337–342.

Min, et al., "Metal–Organic Atomic–Layer Deposition of Titanium–Silicon–Nitride Films", *Applied Physics Letters*, American Inst. of Physics, vol. 75(11) (Sep. 13, 1999).

Maertensson, et al., "Atomic Layer Epitaxy of Copper on Tantalum", *Chemical Vapor Deposition*, 3(1) (Feb. 1, 1997), pp. 45–50.

Ritala, et al., "Atomic Layer Epitaxy Growth of TiN Thin Films", *J. Electrochem. Soc.*, 142(8) (Aug. 1995), pp. 2731–2737.

Elers, et al., "NbC15 as a precursor in atomic layer epitaxy", *Appl. Surf. Sci.*, vol. 82/83 (1994), pp. 468–474.

Lee, "The Preparation of Titanium–Based Thin Film by CVD Using Titanium Chlorides as precursors", *Chemical Vapor Deposition*, 5(2) (Mar. 1999), pp. 69–73.

Martensson, et al.,"Atomic Layer Epitaxy of Copper, Growth & Selectivity in the Cu (II)–2,2.6,6–Tetramethyl–3, 5–Heptanedion ATE/H2 Process", *J. Electrochem. Soc.*, 145(8) (Aug. 1998), pp. 2926–2931.

Min, et al., "Chemical Vapor Deposition of Ti–Si–N Films with Alternating Source Supply", *Mat., Res. Soc. Symp. Proc.*, vol. 564 (Apr. 5, 1999), pp. 207–210.

Bedair, "Atomic layer epitaxy deposition processes", *J. Vac. Sci. Techol.* 12(1) (Jan/Feb 1994).

Yamaga, et al., "Atomic layer epitaxy of ZnS by a new gas supplying system in a low–pressure metalorganic vapor phase epitaxy", *J. of Crystal Growth* 117 (1992), pp. 152–155.

\* cited by examiner

FORMATION OF BORIDE BARRIER LAYERS USING CHEMISORPTION TECHNIQUES

BACKGROUND OF THE DISCLOSURE

1. Field of the Invention

The present invention relates to the formation of boride barrier layers and, more particularly to boride barrier layers formed using chemisorption techniques.

2. Description of the Background Art

In the manufacture of integrated circuits, barrier layers are often used to inhibit the diffusion of metals and other impurities into regions underlying such barrier layers. These underlying regions may include transistor gates, capacitor dielectric, semiconductor substrates, metal lines, as well as many other structures that appear in integrated circuits.

For the current subhalf-micron (0.5 $\mu$m) generation of semiconductor devices, any microscopic reaction at an interface between interconnection layers can cause degradation of the resulting integrated circuits (e.g., increase the resistivity of the interconnection layers). Consequently, barrier layers have become a critical component for improving the reliability of interconnect metallization schemes.

Compounds of refractory metals such as, for example, nitrides, borides, and carbides have been suggested as diffusion barriers because of their chemical inertness and low resistivities (e.g., resistivities typically less than about 200 $\mu\Omega$-cm). In particular, borides such as, for example, titanium diboride ($TiB_2$) have been suggested for use as a barrier material since layers formed thereof generally have low resistivities (e.g., resistivities less than about 150 $\mu\Omega$-cm).

Boride barrier layers are typically formed using chemical vapor deposition (CVD) techniques. For example, titanium tetrachloride ($TiCl_4$) may be reacted with diborane ($B_2H_6$) to form titanium diboride ($TiB_2$) using CVD. However, when Cl-based chemistries are used to form boride barrier layers, reliability problems can occur. In particular, boride layers formed using CVD chlorine-based chemistries typically have a high chlorine (Cl) content (e.g., chlorine content greater than about 3%). A high chlorine content is undesirable because the chlorine may migrate from the boride barrier layer into adjacent interconnection layers, which can increase the contact resistance of such interconnection layers and potentially change the characteristics of integrated circuits made therefrom.

Therefore, a need exists in the art for reliable boride barrier layers for integrated circuit fabrication. Particularly desirable would be reliable boride barrier layers useful for interconnect structures.

SUMMARY OF THE INVENTION

Boride barrier layers for integrated circuit fabrication are provided. In one embodiment, the boride barrier layer comprises one refractory metal. The boride barrier layer may be formed by sequentially chemisorbing alternating monolayers of a boron compound and a refractory metal compound onto a substrate.

In an alternate embodiment, a composite boride barrier layer is formed. The composite boride barrier layer comprises two or more refractory metals. The composite boride barrier layer may be formed by sequentially chemisorbing monolayers of a boron compound and two or more refractory metal compounds onto a substrate.

The boride barrier layer is compatible with integrated circuit fabrication processes. In one integrated circuit fabrication process, the boride barrier layer comprises one refractory metal. The boride barrier layer is formed by sequentially chemisorbing alternating monolayers of a boron compound and one refractory metal compound on a substrate. Thereafter, one or more metal layers are deposited on the boride barrier layer to form an interconnect structure.

In another integrated circuit fabrication process, the boride barrier layer has a composite structure. The composite boride barrier layer comprises two or more refractory metals. The composite boride barrier layer is formed by sequentially chemisorbing monolayers of a boron compound and two or more refractory metal compounds on a substrate. Thereafter, one or more metal layers are deposited on the composite boride barrier layer to form an interconnect structure.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
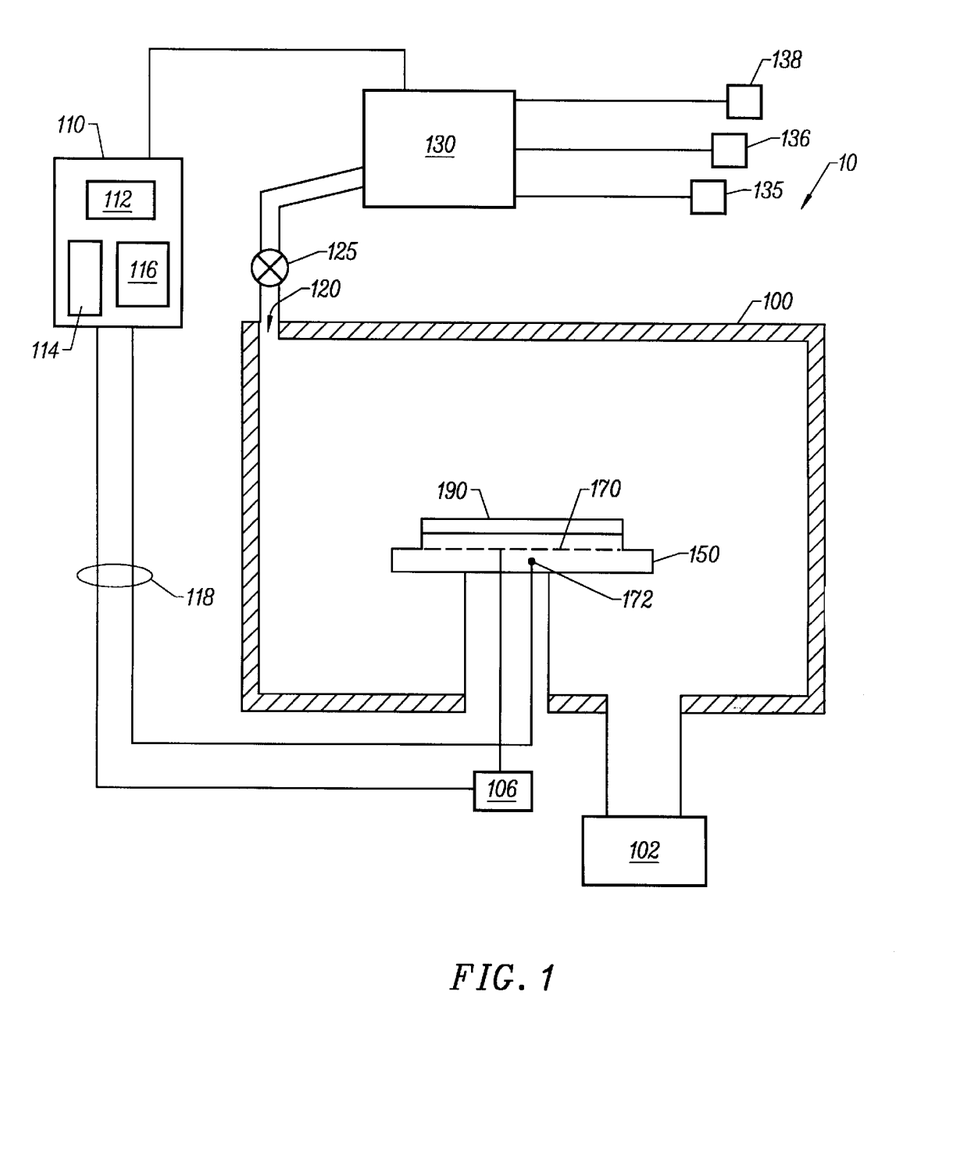
FIG. 1 depicts a schematic illustration of an apparatus that can be used for the practice of embodiments described herein.

FIG. 1 depicts a schematic illustration of a wafer processing system 10 that can be used to form boride barrier layers in accordance with embodiments described herein. The system 10 comprises a process chamber 100, a gas panel 130, a control unit 110, along with other hardware components such as power supplies 106 and vacuum pumps 102. The salient features of process chamber 100 are briefly described below.

Chamber 100

The process chamber 100 generally houses a support pedestal 150, which is used to support a substrate such as a semiconductor wafer 190 within the process chamber 100. Depending on the specific process, the semiconductor wafer 190 can be heated to some desired temperature prior to layer formation.

In chamber 100, the wafer support pedestal 150 is heated by an embedded heater 170. For example, the pedestal 150 may be resistively heated by applying an electric current from an AC power supply 106 to the heater element 170. The wafer 190 is, in turn, heated by the pedestal 150, and can be maintained within a desired process temperature range of, for example, about 20° C. to about 500° C.

A temperature sensor 172, such as a thermocouple, is also embedded in the wafer support pedestal 150 to monitor the temperature of the pedestal 150 in a conventional manner. For example, the measured temperature may be used in a feedback loop to control the electric current applied to the heater element 170 by the power supply 106, such that the wafer temperature can be maintained or controlled at a desired temperature that is suitable for the particular process application. The pedestal 150 is optionally heated using radiant heat (not shown).

A vacuum pump 102 is used to evacuate process gases from the process chamber 100 and to help maintain the desired pressure inside the chamber 100. An orifice 120 is used to introduce process gases into the process chamber 100. The dimensions of the orifice 120 are variable and typically depend on the size of the process chamber 100.

The orifice 120 is coupled to a gas panel 130 via a valve 125. The gas panel 130 provides process gases from two or more gas sources 135, 136 to the process chamber 100 through orifice 120 and valve 125. The gas panel 130 also provides a purge gas from a purge gas source 138 to the process chamber 100 through orifice 120 and valve 125.

A control unit 110, such as a computer, controls the flow of various process gases through the gas panel 130 as well as valve 125 during the different steps of a wafer process sequence. Illustratively, the control unit 110 comprises a central processing unit (CPU) 112, support circuitry 114, and memories containing associated control software 116. In addition to the control of process gases through the gas panel 130, the control unit 110 is also responsible for automated control of the numerous steps required for wafer processing—such as wafer transport, temperature control, chamber evacuation, among other steps.

The control unit 110 may be one of any form of general purpose computer processor that can be used in an industrial setting for controlling various chambers and sub-processors. The computer processor may use any suitable memory, such as random access memory, read only memory, floppy disk drive, hard disk, or any other form of digital storage, local or remote. Various support circuits may be coupled to the computer processor for supporting the processor in a conventional manner. Software routines as required may be stored in the memory or executed by a second processor that is remotely located. Bi-directional communications between the control unit 110 and the various components of the wafer processing system 10 are handled through numerous signal cables collectively referred to as signal buses 118, some of which are illustrated in FIG. 1.

Boride Barrier Layer Formation

Figure 2A:
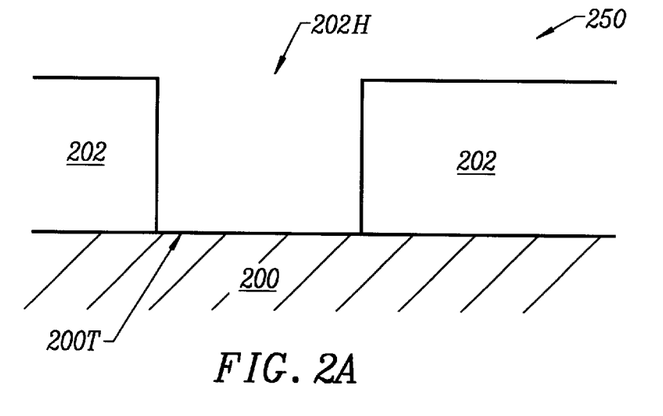
FIGS. 2a–2c depict cross-sectional views of a substrate structure at different stages of integrated circuit fabrication incorporating a boride barrier layer.
Figure 2B:
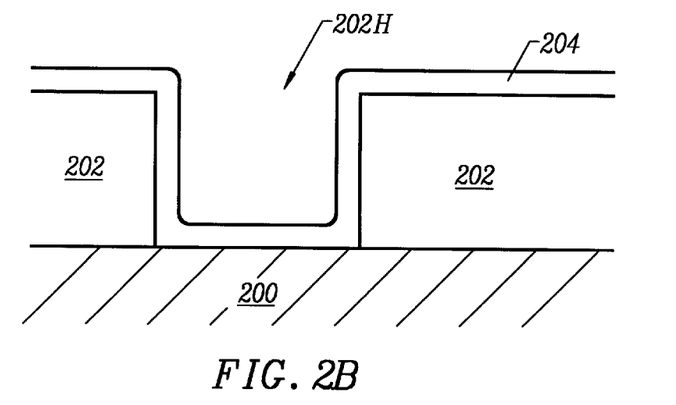
Figure 2C:
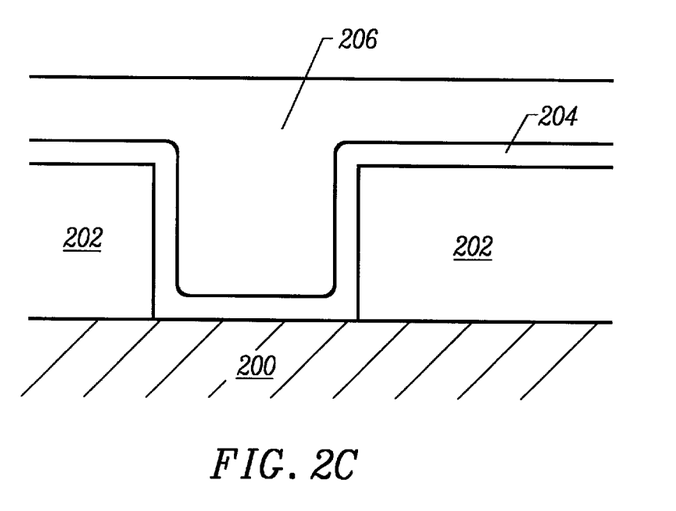

FIGS. 2a–2c illustrate one preferred embodiment of boride layer formation for integrated circuit fabrication of an interconnect structure. In general, the substrate 200 refers to any workpiece upon which film processing is performed, and a substrate structure 250 is used to generally denote the substrate 200 as well as other material layers formed on the substrate 200. Depending on the specific stage of processing, the substrate 200 may be a silicon semiconductor wafer, or other material layer, which has been formed on the wafer. FIG. 2a, for example, shows a cross-sectional view of a substrate structure 250, having a material layer 202 thereon. In this particular illustration, the material layer 202 may be an oxide (e.g., silicon dioxide). The material layer 202 has been conventionally formed and patterned to provide a contact hole 202H extending to the top surface 200T of the substrate 200.

FIG. 2b shows a boride layer 204 conformably formed on the substrate structure 250. The boride layer 204 is formed by chemisorbing monolayers of a boron containing compound and a refractory metal compound on the substrate structure 250.

The monolayers are chemisorbed by sequentially providing a boron containing compound and one or more refractory metal compounds to a process chamber. In a first sequential chemisorption process, the monolayers of the boron containing compound and one refractory metal compound are alternately chemisorbed on a substrate 300 as shown in FIGS. 3a–3c.

Figure 3A:
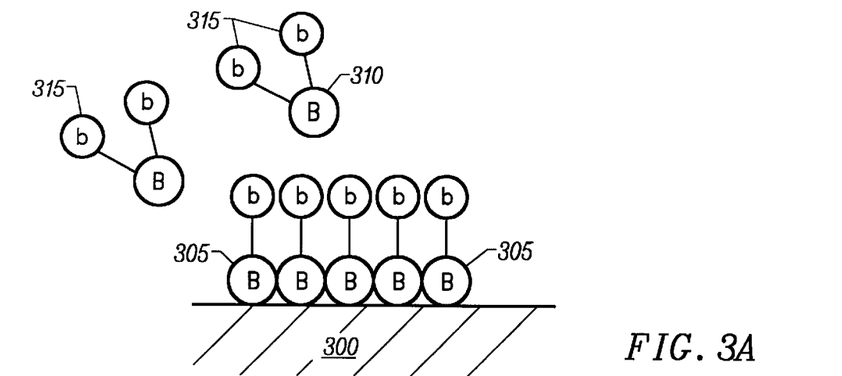
FIGS. 3a–3c depict cross-sectional views of a substrate undergoing a first sequential chemisorption process of a boron compound and one refractory metal compound to form a boride barrier layer.
Figure 3B:
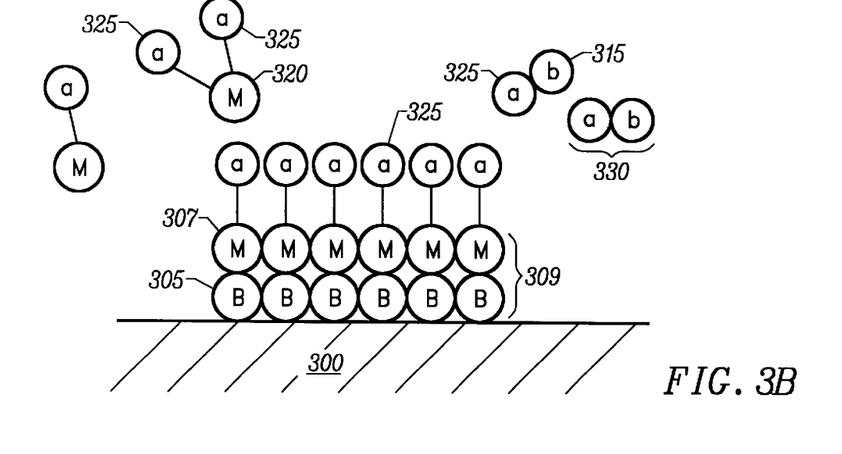
Figure 3C:
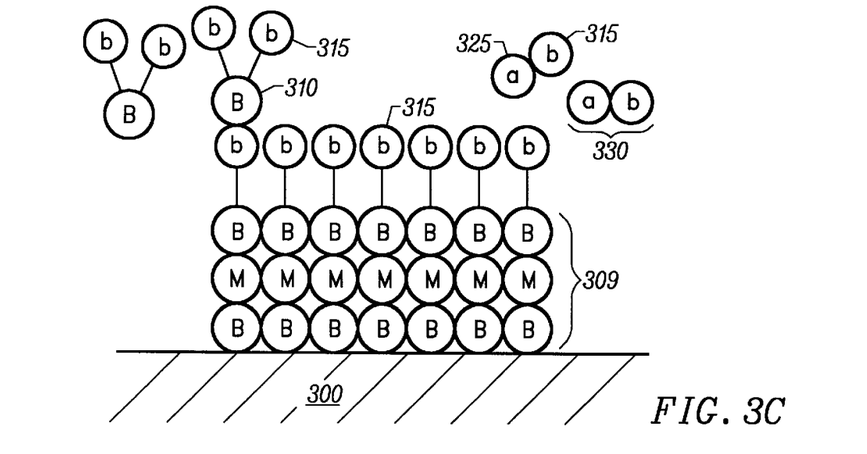

FIG. 3a depicts a cross-sectional view of a substrate 300, which may be in a stage of integrated circuit fabrication. A monolayer of a boron-containing compound 305 is chemisorbed on the substrate 300 by introducing a pulse of a boron containing gas into a process chamber similar to that shown in FIG. 1. The boron-containing compound typically combines boron atoms 310 with one or more reactive species b 315. During boride layer formation, the reactive species b 315 form byproducts that are transported from the substrate 300 surface by the vacuum system.

The chemisorbed monolayer of the boron containing compound 305 is self-limiting in that only one monolayer may be chemisorbed onto the substrate 300 surface during a given pulse. Only one monolayer of the boron containing compound is chemisorbed on the substrate because the substrate has a limited surface area. This limited surface area provides a finite number of sites for chemisorbing the boron containing compound. Once the finite number of sites are occupied by the boron containing compound, further chemisorption of the boron containing compound will be blocked.

The boron containing compound may be for example a borane compound having the general formula $B_xH_y$, where x has a range between 1 and 10, and y has a range between 3 and 30. For example, borane ($BH_3$), diborane ($B_2H_6$), triborane ($B_3H_9$), tetraborane ($B_4H_{12}$), pentaborane ($B_5H_{15}$), hexaborane ($B_6H_{18}$), heptaborane ($B_7H_{21}$), octaborane ($B_8H_{24}$), nanoborane ($B_9H_{27}$), and decaborane ($B_{10}H_{30}$) may be used as the boron containing compound.

After the monolayer of the boron compound is chemisorbed onto the substrate 300, excess boron containing compound is removed from the process chamber by introducing a pulse of a purge gas thereto. Purge gases such as, for example helium (He), argon (Ar), nitrogen ($N_2$), ammonia ($NH_3$), and hydrogen ($H_2$), among others may be used.

After the process chamber has been purged, a pulse of one refractory metal compound is introduced into the process chamber. Referring to FIG. 3b, a layer of the refractory metal compound 307 is chemisorbed on the boron monolayer 305. The refractory metal compound typically combines refractory metal atoms 320 with one or more reactive species a 325.

The chemisorbed monolayer of the refractory metal compound 307 reacts with the boron-containing monolayer 305 to form a boride layer 309. The reactive species a 325 and b 315 form byproducts ab 330 that are transported from the substrate 300 surface by the vacuum system. The reaction of the refractory metal compound 307 with the boron monolayer 305 is self-limited, since only one monolayer of the boron compound was chemisorbed onto the substrate 300 surface.

The refractory metal compound may include refractory metals such as for example titanium (Ti), tungsten (W), tantalum (Ta), zirconium (Zr), hafnium (Hf), molybdenum (Mo), niobium (Nb), vanadium (V), and chromium (Cr), among others combined with reactive species such as, for example chlorine (Cl) and fluorine (F). For example, titanium tetrachloride ($TiCl_4$), tungsten hexafluoride ($WF_6$), tantalum pentachloride ($TaCl_5$), zirconium tetrachloride ($ZrCl_4$), hafnium tetrachloride ($HfCl_4$), molybdenum pentachloride ($MoCl_5$), niobium pentachloride ($NbCl_5$), vanadium pentachloride ($VCl_5$), chromium tetrachloride ($CrCl_4$) may be used as the refractory metal compound.

After the monolayer of the refractory metal compound is chemisorbed onto the substrate 300, any excess refractory metal compound is removed from the process chamber by introducing another pulse of the purge gas therein. Thereafter, as shown in FIG. 3c, the boride layer deposition sequence of alternating monolayers of the boron containing compound and the refractory metal compound are repeated until a desired boride layer thickness is achieved. The boride layer may, for example, have a thickness in a range of about 200 Å to about 5000 Å, and more preferably, about 2500 Å.

In FIGS. 3a–3c, boride layer formation is depicted as starting with the chemisorption of a boron containing monolayer on the substrate followed by a monolayer of a refractory metal compound. Alternatively, the boride layer formation may start with the chemisorption of a monolayer of a refractory metal compound on the substrate followed by a monolayer of the boron containing compound.

The pulse time for each pulse of the boron-containing compound, the one or more refractory metal compounds, and the purge gas is variable and depends on the volume capacity of the deposition chamber as well as the vacuum system coupled thereto. Similarly, the time between each pulse is also variable and depends on the volume capacity of the process chamber as well as the vacuum system coupled thereto.

In general, the alternating monolayers may be chemisorbed at a substrate temperature less than about 500° C., and a chamber pressure less than about 100 torr. A pulse time of less than about 1 second for the boron-containing compound, and a pulse time of less than about 1 second for the refractory metal compounds are typically sufficient to chemisorb the alternating monolayers that comprise the boride layer on the substrate. A pulse time of less than about 1 second for the purge gas is typically sufficient to remove the reaction byproducts as well as any residual materials remaining in the process chamber.

Figure 4A:
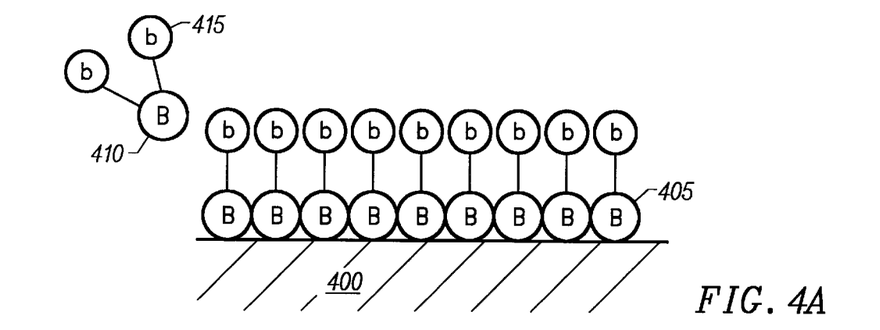
FIGS. 4a–4d depict cross-sectional views of a substrate undergoing a second sequential chemisorption process of a boron compound and two refractory metal compounds to form a composite boride barrier layer.

In a second chemisorption process, the boron containing monolayers and two or more refractory metal compounds are alternately chemisorbed on the substrate to form a composite boride layer. FIG. 4a depicts a cross-sectional view of a substrate 400, which may be in a stage of integrated circuit fabrication. A self-limiting monolayer of a boron-containing compound 405 is chemisorbed on the substrate 400 by introducing a pulse of a boron containing compound into a process chamber similar to that shown in FIG. 1 according to the process conditions described above with reference to FIGS. 2a–2c. The boron-containing compound combines boron atoms 410 with one or more reactive species b 415.

After the monolayer of the boron compound 405 is chemisorbed onto the substrate 400, excess boron containing compound is removed from the process chamber by introducing a pulse of a purge gas thereto.

Figure 4B:
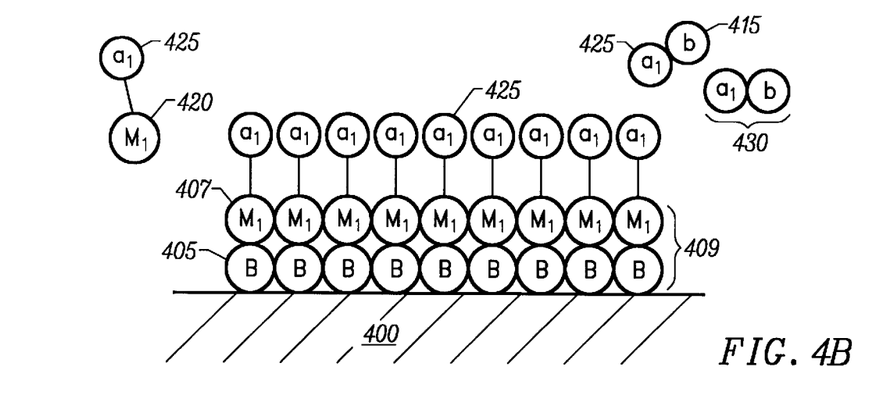

Referring to FIG. 4b, after the process chamber has been purged, a pulse of a first refractory metal compound $M_1a_1$ is introduced into the process chamber. A layer of the first refractory metal compound 407 is chemisorbed on the boron monolayer 405. The first refractory metal compound typically combines first refractory metal atoms $M_1$ 420 with one or more reactive species $a_1$ 425.

The chemisorbed monolayer of the first refractory metal compound 407 reacts with the boron-containing monolayer 405 to form a boride monolayer 409. The reactive species $a_1$ 425 and b 415 form byproducts $a_1b$ 430 that are transported from the substrate 400 surface by the vacuum system.

After the monolayer of the first refractory metal compound 407 is chemisorbed onto the substrate 400, the excess first refractory metal compound $M_1a_1$ is removed from the process chamber by introducing another pulse of the purge gas therein.

Figure 4C:
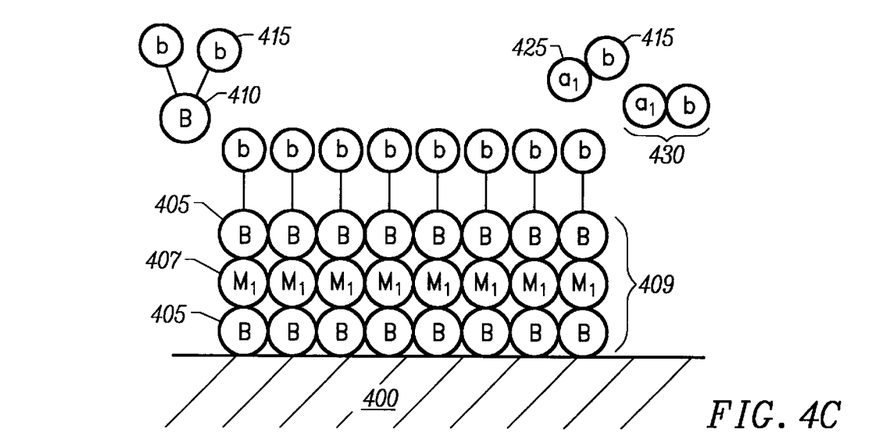

Another pulse of the boron containing compound is than introduced into the process chamber. A monolayer of the boron containing compound 405 is chemisorbed on the first refractory metal monolayer 407, as shown in FIG. 4c. The chemisorbed monolayer of the boron containing compound 405 reacts with the first refractory metal monolayer 407 to form a boride layer 409. The reactive species $a_1$ 425 and b 415 form byproducts $a_1b$ 430 that are transported from the substrate 400 surface by the vacuum system.

After the monolayer of the boron compound 405 is chemisorbed onto the first refractive metal monolayer 407, excess boron containing compound is removed from the process chamber by introducing a pulse of a purge gas thereto.

Figure 4D:
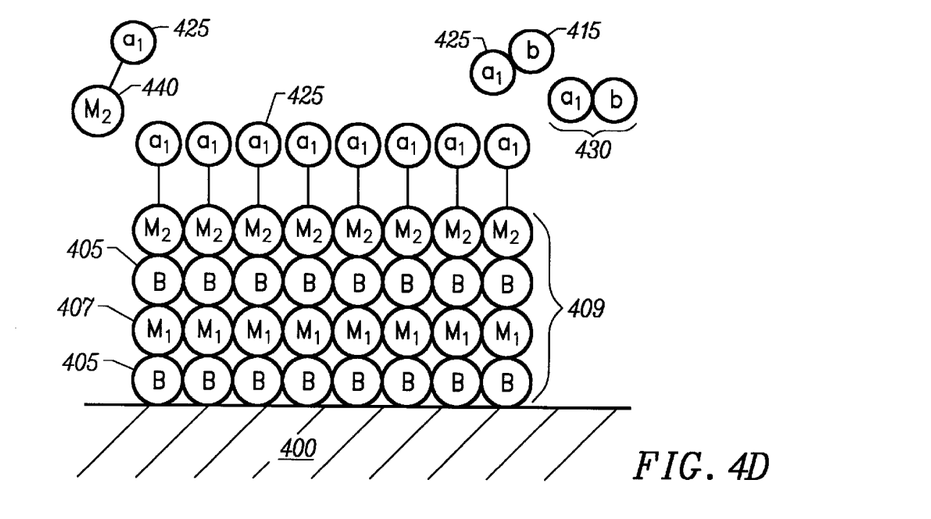

Referring to FIG. 4d, after the process chamber has been purged, a pulse of a second refractory metal compound $M_2a_1$ is introduced into the process chamber. A layer of the second refractory metal compound 411 is chemisorbed on the boron monolayer 405. The second refractory metal compound typically combines second refractory metal atoms $M_2$ 440 with one or more reactive species $a_1$ 425.

The chemisorbed monolayer of the second refractory metal compound 411 reacts with the boron-containing monolayer 405 to form the composite boride layer 409. The reactive species $a_1$ 425 and b 415 form byproducts $a_1b$ 430 that are transported from the substrate 400 surface by the vacuum system.

After the monolayer of the second refractory metal compound 411 is chemisorbed onto the substrate 400, the excess second refractory metal compound $M_2a_1$ is removed from the process chamber by introducing another pulse of the purge gas therein.

Thereafter, the boride layer deposition sequence of alternating monolayers of the boron containing compound and the two refractory metal compounds $M_1a_1$ and $M_2a_1$ are repeated until a desired boride layer thickness is achieved.

In FIGS. 4a–4d, boride layer formation is depicted as starting with the chemisorption of the boron containing monolayer on the substrate followed by monolayers of the two refractory metal compounds. Alternatively, the boride layer formation may start with the chemisorption of monolayers of either of the two refractory metal compounds on the substrate followed by monolayers of the boron containing compound. Optionally, monolayers of more than two refractory metal compounds may be chemisorbed on the substrate 400.

In a third chemisorption process, the boron containing monolayers and two or more refractory metal compounds are alternately chemisorbed on the substrate to form a composite boride layer, as illustrated in FIGS. 5a–5d.

Figure 5A:
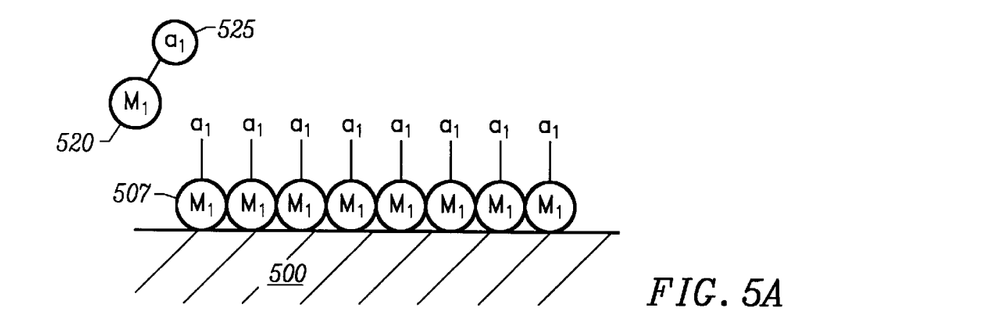
FIGS. 5a–5d depict cross-sectional views of a substrate undergoing a third sequential chemisorption of a boron compound and two refractory metal compounds to form a composite boride barrier layer.

FIG. 5a depicts a cross-sectional view of a substrate 500, which may be in a stage of integrated circuit fabrication. A self-limiting monolayer of a first refractory metal compound 507 is chemisorbed on the substrate 500 by introducing a pulse of a first refractory metal compound $M_1a_1$ into a process chamber similar to that shown in FIG. 1 according to the process conditions described above with reference to FIGS. 2a–2c.

After the monolayer of the first refractory metal compound 507 is chemisorbed onto the substrate 500, excess first refractory metal compound is removed from the process chamber by introducing a pulse of a purge gas thereto.

Figure 5B:
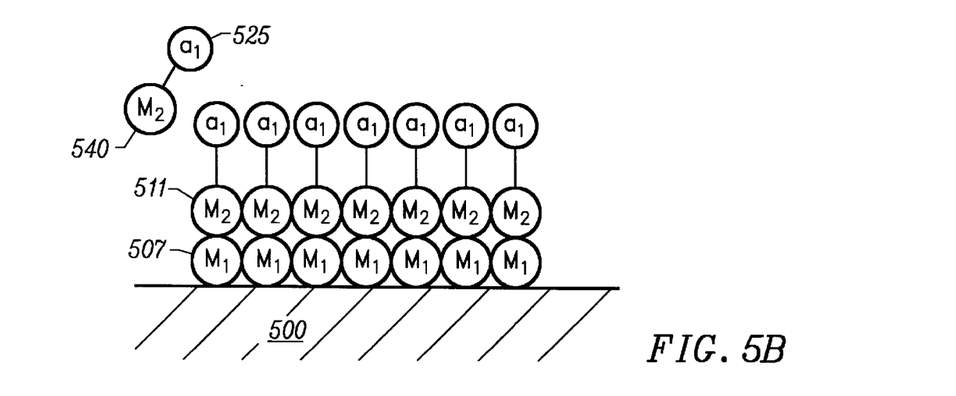

Referring to FIG. 5b, after the process chamber has been purged, a pulse of a second refractory metal compound $M_2a_1$ is introduced into the process chamber. A layer of the second refractory metal compound 511 is chemisorbed on the first refractory metal monolayer 507.

After the monolayer of the second refractory metal compound 511 is chemisorbed onto the substrate 500, the excess second refractory metal compound $M_2a_1$ is removed from the process chamber by introducing another pulse of the purge gas therein.

Figure 5C:
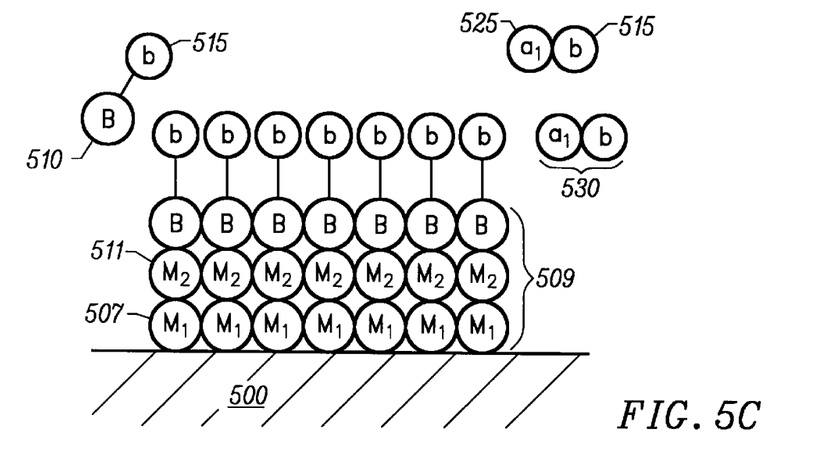

A pulse of a boron containing compound is than introduced into the process chamber. A monolayer of the boron containing compound 505 is chemisorbed on the second refractory metal monolayer 511, as shown in FIG. 5c. The chemisorbed monolayer of the boron containing compound 505 reacts with the second refractory metal monolayer 511 to form a composite boride layer 509. The reactive species a, 525 and b 515 form byproducts $a_1b$ 530 that are transported from the substrate 500 surface by the vacuum system.

After the monolayer of the boron compound 505 is chemisorbed onto the second refractory metal monolayer 511, excess boron containing compound is removed from the process chamber by introducing a pulse of a purge gas thereto.

Figure 5D:
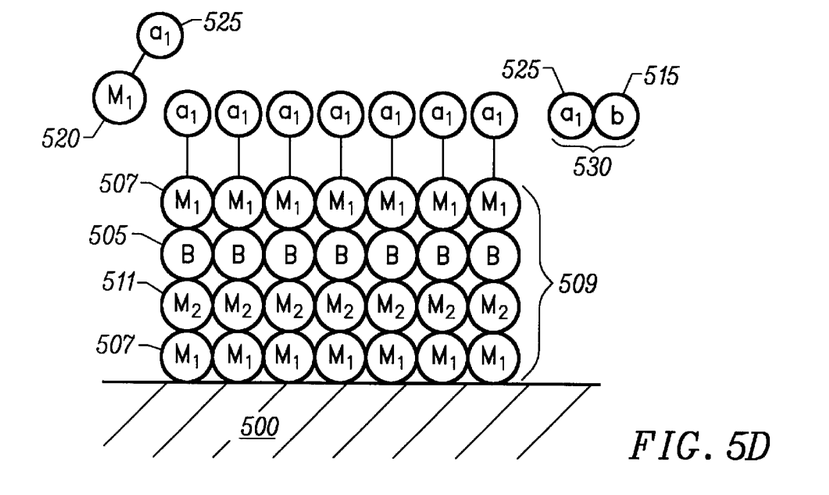

Referring to FIG. 5d, after the process chamber has been purged, a pulse of the first refractory metal compound $M_1a_1$ is introduced into the process chamber. A monolayer of the first refractory metal compound 507 is chemisorbed on the boron monolayer 505.

The chemisorbed monolayer of the first refractory metal compound 507 reacts with the boron-containing monolayer 505 to form the boride monolayer 509. The reactive species $a_1$ 525 and b 515 form byproducts $a_1b$ 530 that are transported from the substrate 500 surface by the vacuum system.

After the monolayer of the first refractory metal compound 507 is chemisorbed onto the substrate 500, the excess first refractory metal compound $M_1a_1$ is removed from the process chamber by introducing another pulse of the purge gas therein.

Thereafter, the boride layer deposition sequence of alternating monolayers of the boron containing compound and the two refractory metal compounds $M_1a_1$ and $M_2a_1$ are repeated until a desired boride layer thickness is achieved.

In FIGS. 5a–5d, boride layer formation is depicted as starting with the chemisorption of the first refractory metal monolayer on the substrate followed by monolayers of the second refractory metal compound and the boron containing compound. Alternatively, the boride layer formation may start with the chemisorption of the monolayer of the boron containing compound on the substrate followed by the monolayers of the two refractory metal compounds. Optionally, monolayers of more than two refractory metal compounds may be chemisorbed on the substrate 500.

The sequential deposition processes described above advantageously provide good step coverage for the boride layer, due to the monolayer chemisorption mechanism used for forming the boride layer. In particular, boride layer formation using the monolayer chemisorption mechanism is believed to contribute to a near perfect step coverage over complex substrate topographies.

Furthermore, in chemisorption processes, since only one monolayer may be absorbed on the topographic surface, the size of the deposition area is largely independent of the amount of precursor gas remaining in the reaction chamber once a monolayer has been formed.

Referring to FIG. 2c, after the formation of the boride layer 204, a contact layer 206 may be formed thereon to complete the interconnect structure. The contact layer 206 is preferably selected from the group of aluminum (Al), copper (Cu), tungsten (W), and combinations thereof.

The contact layer 206 may be formed, for example, using chemical vapor deposition (CVD), physical vapor deposition (PVD), or a combination of both CVD and PVD. For example, an aluminum (Al) layer may be deposited from a reaction of a gas mixture containing dimethyl aluminum hydride (DMAH) and hydrogen ($H_2$) or argon (Ar) or other DMAH containing compounds, a CVD copper layer may be deposited from a gas mixture containing $Cu^{+2}(hfac)_2$ (copper hexafluoro acetylacetonate), $Cu^{+2}(fod)_2$ (copper heptafluoro dimethyl octanediene), $Cu^{+1}$hfac TMVS (copper hexafluoro acetylacetonate trimethylvinylsilane), or combinations thereof, and a CVD tungsten layer may be deposited from a gas mixture containing tungsten hexafluoride ($WF_6$). A PVD layer is deposited from a copper target, an aluminum target, or a tungsten target.

Figure 6A:
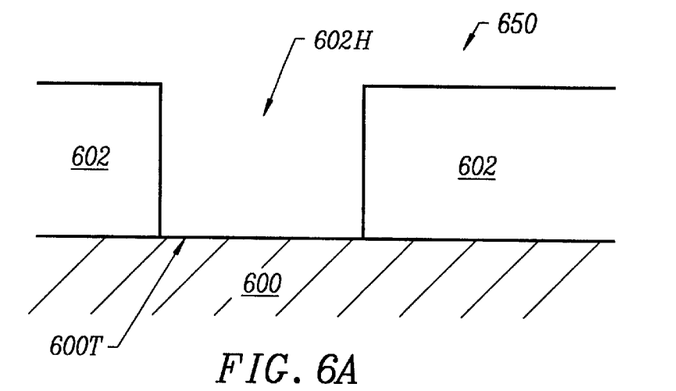
FIGS. 6a–6c depict cross-sectional views of a substrate structure at different stages of integrated circuit fabrication incorporating more than one boride barrier layer.
Figure 6B:
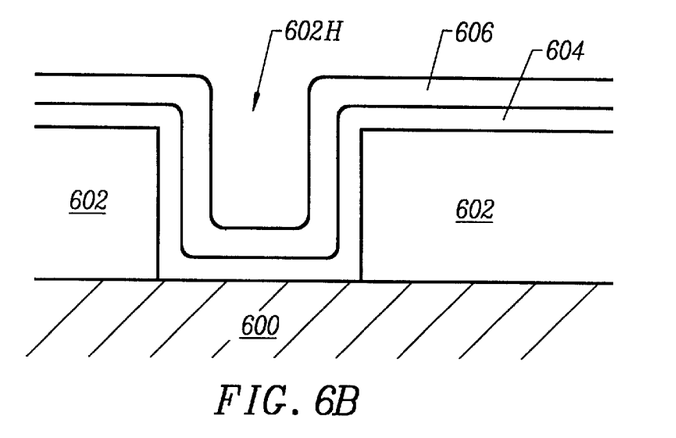
Figure 6C:
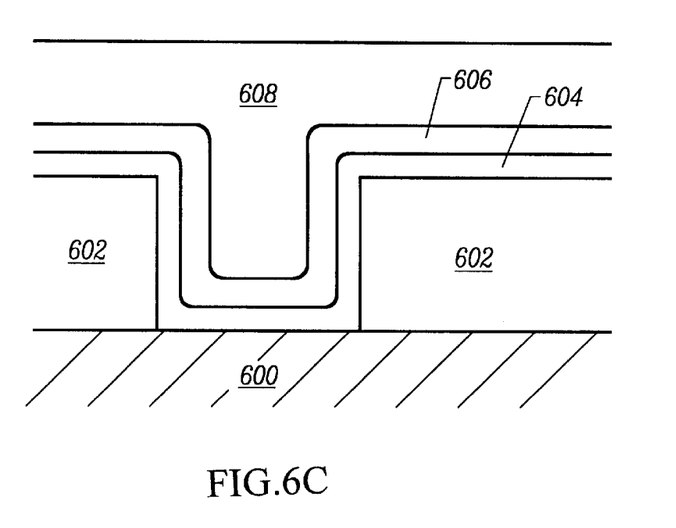

FIGS. 6a–6c illustrate an alternate embodiment of boride layer formation for integrated circuit fabrication of the interconnect structure. In general, the substrate 600 refers to any workpiece upon which film processing is performed, and a substrate structure 650 is used to generally denote the substrate 600 as well as other material layers formed on the substrate 600. Depending on the specific stage of processing, the substrate 600 may be a silicon semiconductor wafer, or other material layer, which has been formed on the wafer. FIG. 6a, for example, shows a cross-sectional view of a substrate structure 650, having a material layer 602 thereon. In this particular illustration, the material layer 602 may be an oxide (e.g., silicon dioxide). The material layer 602 has been conventionally formed and patterned to provide a contact hole 602H extending to the top surface 600T of the substrate 600.

FIG. 6b shows two boride layers 604, 606 conformably formed on the substrate structure 650. The boride layers 604, 606 are formed by chemisorbing monolayers of a boron containing compound and one or more refractory metal compounds on the substrate structure 650 as described above with reference to FIGS. 3a–5d. The two boride layers 604, 606 may each comprise one or more refractory metals. The thicknesses of the two or more boride layers 604, 606 may be variable depending on the specific stage of processing. Each boride layer 604, 606 may, for example, have a thickness in a range of about 200 Å to about 5000 Å.

Referring to FIG. 6c, after the formation of the boride layers 604, 606, a contact layer 608 may be formed thereon to complete the interconnect structure. The contact layer 608 is preferably selected from the group of aluminum (Al), copper (Cu), tungsten (W), and combinations thereof.

The specific process conditions disclosed in the above discussion are meant for illustrative purposes only. Other combinations of process parameters such as precursor and inert gases, flow ranges, pressure and temperature may also be used in forming the boride layer of the present invention.

Although several preferred embodiments, which incorporate the teachings of the present invention, have been shown and described in detail, those skilled in the art can readily devise many other varied embodiments that still incorporate these teachings.

What is claimed is:

1. A method of forming a barrier layer structure for use in integrated circuit fabrication, comprising:

positioning a substrate having an oxide layer thereon, wherein the oxide layer has apertures formed therein to a top surface of the substrate;

forming a first boride layer comprising two or more refractory metals on at least a portion of the oxide layer and the substrate surface by chemisorbing monolayers of a boron containing compound and one or more refractory metal compounds on the substrate; and forming a second boride layer comprising one or more refractory metals on the first boride layer by chemisorbing monolayers of a boron containing compound and one or more refractory metal compounds on the substrate.

2. The method of claim 1 wherein the monolayers of the boron containing compound and the one or more refractory metal compounds are alternately chemisorbed on the substrate.

3. The method of claim 2 wherein one monolayer of the boron containing compound is chemisorbed between each chemisorbed monolayer of the one or more refractory metal compounds.

4. The method of claim 2 wherein one monolayer of the boron containing compound is chemisorbed on the substrate after two or monolayers of the one or more refractory metal compounds are chemisorbed thereon.

* * * * *